US012690157B2

(12) United States Patent
He

(10) Patent No.: US 12,690,157 B2
(45) Date of Patent: Jul. 21, 2026

(54) TEMPERATURE MANAGEMENT APPARATUS FOR AN INFORMATION HANDLING SYSTEM

(71) Applicant: Dell Products L.P., Round Rock, TX (US)

(72) Inventor: Qinghong He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 322 days.

(21) Appl. No.: 18/508,388

(22) Filed: Nov. 14, 2023

(65) Prior Publication Data

US 2025/0159837 A1     May 15, 2025

(51) Int. Cl.
*H05K 7/20*        (2006.01)
*G06F 1/20*        (2006.01)

(52) U.S. Cl.
CPC ......... *H05K 7/20136* (2013.01); *G06F 1/203* (2013.01); *H05K 7/2039* (2013.01)

(58) Field of Classification Search
CPC ... H05K 7/20136; H05K 7/2039; G06F 1/203
See application file for complete search history.

(56) References Cited

U.S. PATENT DOCUMENTS

| 7,515,414 B2 * | 4/2009 | Horng | ................... | H10W 40/43 |
| | | | | 361/695 |
| 7,545,645 B2 * | 6/2009 | Kuan | ................... | H10W 40/73 |
| | | | | 165/185 |

| 7,568,517 B2 * | 8/2009 | Hwang | ................. | H10W 40/73 |
| | | | | 165/122 |
| 8,787,021 B2 * | 7/2014 | Murakami | ................ | G06F 1/20 |
| | | | | 361/720 |
| 11,028,857 B2 * | 6/2021 | He | ......................... | F04D 19/007 |
| 11,477,911 B1 * | 10/2022 | He | ......................... | H01L 23/427 |
| 2006/0181849 A1 * | 8/2006 | Wang | .................... | H01L 23/427 |
| | | | | 257/E23.099 |
| 2007/0023411 A1 * | 2/2007 | Angelis | ................ | B60H 1/2225 |
| | | | | 219/202 |
| 2007/0267172 A1 * | 11/2007 | Hwang | ................. | H01L 23/467 |
| | | | | 257/E23.099 |
| 2008/0043436 A1 * | 2/2008 | Hung | .................... | H10W 40/73 |
| | | | | 257/E23.099 |
| 2008/0180913 A1 * | 7/2008 | Kaneko | .................. | G06F 1/203 |
| | | | | 361/697 |
| 2008/0251237 A1 * | 10/2008 | Hung | ................. | H05K 7/20154 |
| | | | | 361/679.48 |
| 2009/0139691 A1 * | 6/2009 | Wei | ........................... | G06F 1/20 |
| | | | | 165/80.3 |
| 2010/0294463 A1 * | 11/2010 | Nie | ........................... | G06F 1/20 |
| | | | | 165/80.3 |

(Continued)

*Primary Examiner* — Stephen S Sul

(74) *Attorney, Agent, or Firm* — McDermott Will & Schulte LLP

(57) ABSTRACT

A temperature management apparatus, including a heat sink, including a base; a plurality of fins extending from the base in a first direction, the plurality of fins forming a first interface having a first angle with respect to a plane that is perpendicular to the first direction; and a fan including a second interface, the fan thermally coupled to the heat sink such that the second interface has a second angle with respect to the plane, the second angle the same as the first angle.

14 Claims, 7 Drawing Sheets

(56)     References Cited

U.S. PATENT DOCUMENTS

2023/0189471 A1*   6/2023   Hashiba ............. H05K 7/20154
                                                                  361/690
2023/0225083 A1*   7/2023   He .......................... G06F 1/203
                                                                  361/688
2023/0403823 A1*  12/2023   Kitamura .............. G06F 1/1616
2024/0206114 A1*   6/2024   Sanada ............. H05K 7/20154

* cited by examiner

TEMPERATURE MANAGEMENT APPARATUS FOR AN INFORMATION HANDLING SYSTEM

BACKGROUND

Field of the Disclosure

The disclosure relates generally to an information handling system, and in particular, a temperature management apparatus for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

When the information handling system includes a portable computing device such as a laptop, there is a tradeoff between having a large thermal footprint for better cooling and enough circuit board layout area for all of the electronic components of the device.

SUMMARY

Innovative aspects of the subject matter described in this specification may be embodied in a temperature management apparatus, including: a heat sink, including: a base; a plurality of fins extending from the base in a first direction, the plurality of fins forming a first interface having a first angle with respect to a plane that is perpendicular to the first direction; and a fan including a second interface, the fan thermally coupled to the heat sink such that the second interface has a second angle with respect to the plane, the second angle the same as the first angle.

Other embodiments of these aspects include corresponding systems and apparatus.

These and other embodiments may each optionally include one or more of the following features. For instance, the fan is thermally coupled to the heat sink such that the first interface of the heat sink is proximate to the second interface of the fan. The fan is thermally coupled to the heat sink such that the first interface of the heat sink is aligned with the second interface of the fan. The heat sink includes a first side and a second side positioned opposite to the first side, wherein a first length of a first fin of the plurality of fins at the first side of the heat sink is less than a second length of a second fin of the plurality of fins at the second side of the heat sink. A length of the remaining fins between the first fin and the second fin increase from the first end of the heat sink to the second end of the heat sink. The fan includes a first end and a second end positioned opposite to the first end, wherein the fan is thermally coupled to the heat sink such that the first end of the fan is positioned proximate to the first side of the heat sink and the second end of the fan is positioned proximate to the second side of the heat sink, wherein a first velocity of air output by the fan at the second interface at the first end of the fan is less than a second velocity of air output by the fan at the second interface at the second end of the fan. Further including a first and a second heat pipe in thermal communication with the heat sink, wherein the first heat pipe has a first length between the first side and the second side of the heat sink and the second heat pipe has a second length between the first side and the second side of the heat sink, wherein the first length is greater than the second length.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
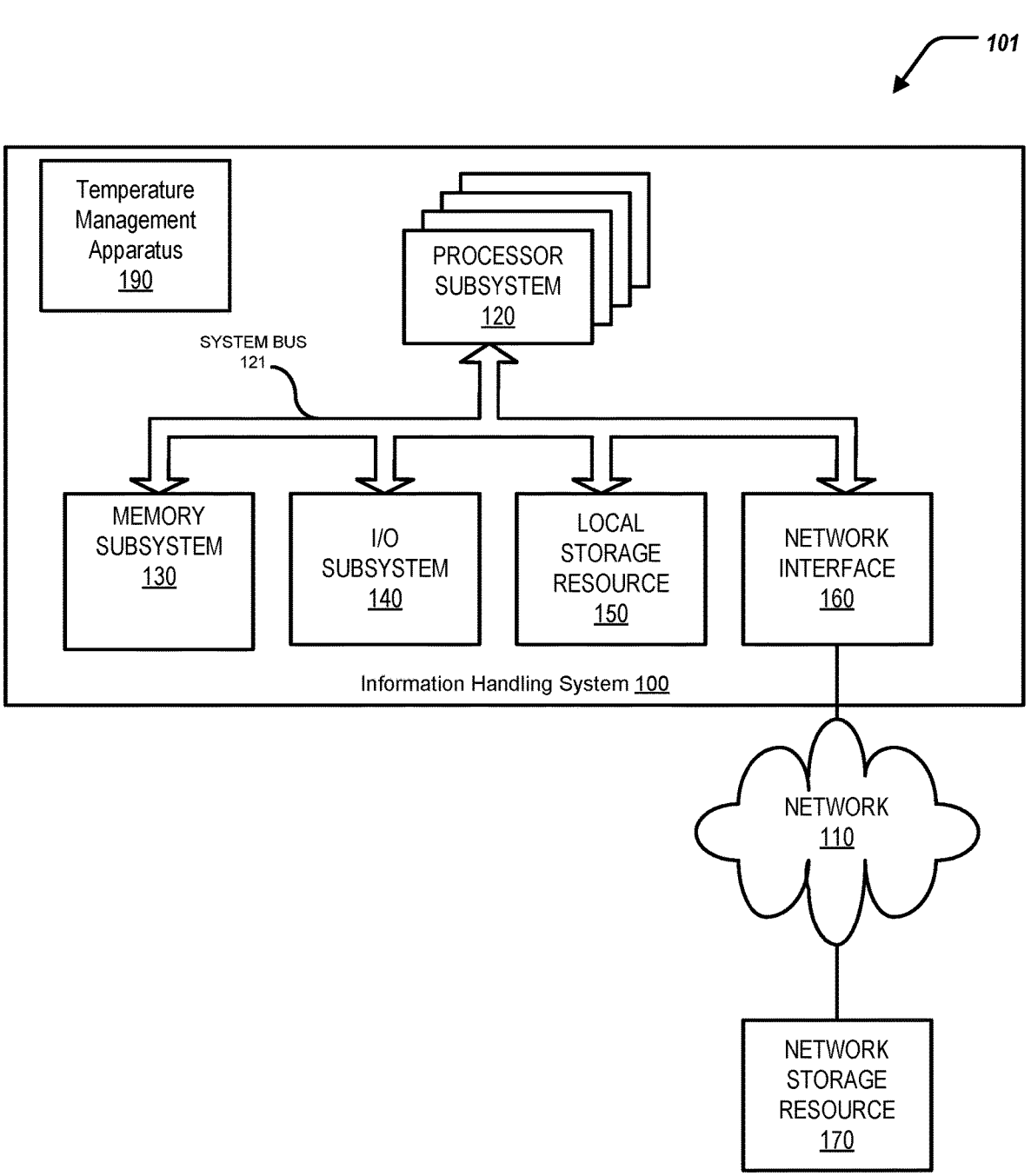
FIG. 1 is a block diagram of selected elements of an embodiment of an information handling system.

This disclosure discusses a temperature management apparatus for an information handling system. In short, the temperature management apparatus can facilitate management of the temperature of the information handling system, and in particular, a fan can facilitate removal of heat by pushing air through a heat sink and ultimately through heat pipes. To that end, "real estate" within the information handling system can be at a premium, thus any space savings of the heat sink and the fan is desirable. A physical shape of the heat sink, the fan, or both can be adjusted to increase space savings at the information handling system, described further herein.

Specifically, this disclosure discusses a temperature management apparatus, including: a heat sink, including: a base; a plurality of fins extending from the base in a first direction, the plurality of fins forming a first interface having a first angle with respect to a plane that is perpendicular to the first direction; and a fan including a second interface, the fan thermally coupled to the heat sink such that the second interface has a second angle with respect to the plane, the second angle corresponding to the first angle.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-7 wherein like numbers are used to indicate like and corresponding parts.

Turning now to the drawings, FIG. 1 illustrates a block diagram depicting selected elements of a computing environment 101 including an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

The information handling system 100 can further include a temperature management apparatus 190. The temperature management apparatus 190 can facilitate cooling of the information handling system 100, described further herein.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
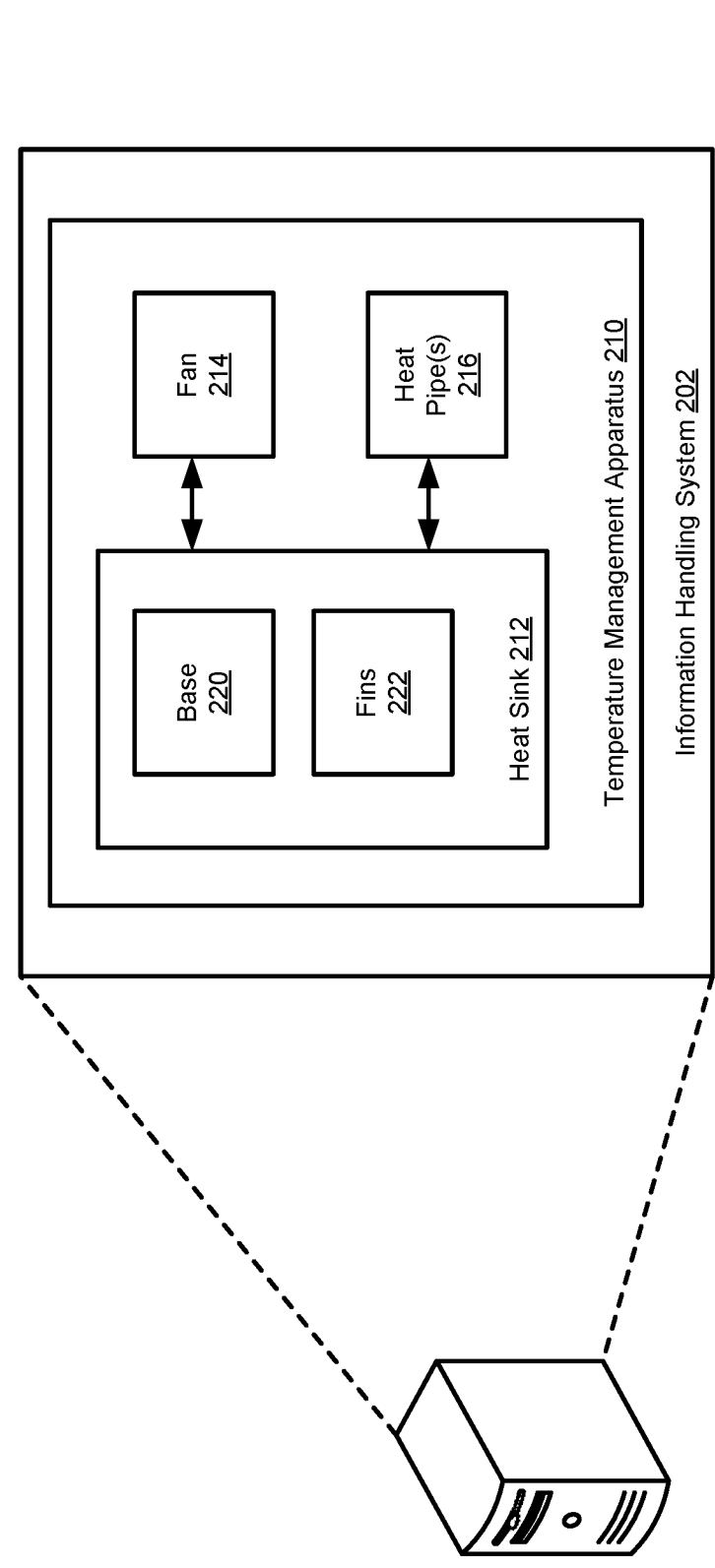
FIG. 2 illustrates a block diagram of an information handling system, including a temperature management apparatus.

Turning to FIG. 2, FIG. 2 illustrates an environment 200 including an information handling system 202. The information handling system 202 can include a temperature management apparatus 210. The temperature management apparatus 210 can include a heat sink 212, a fan 214, and a heat pipe (or heat pipes) 216. The heat sink 212 can include a base 220 and fins 222.

In some examples, the information handling system 202 is similar to, or includes, the information handling system 100 of FIG. 1. In some examples, the temperature management apparatus 190 is the same, or substantially the same, as the temperature management apparatus 190 of FIG. 1.

The heat sink 212 can be in thermal communication with the fan 214 and the heat pipe(s) 216, described further herein. The heat sink 212 can be physically coupled to the fan 214 and the heat pipe(s) 216, described further herein.

In short, the temperature management apparatus 210 can facilitate management of the temperature of the information handling system 202, and in particular, the fan 214 can facilitate removal of heat by pushing air through the heat sink 212 and ultimately through the heat pipes 216. To that end, "real estate" within the information handling system 202 can be at a premium, thus any space savings of the heat sink 212 and the fan 214 is desirable. A physical shape of the heat sink 212, the fan 214, or both can be adjusted to increase space savings at the information handling system 202, described further herein.

Figure 3:
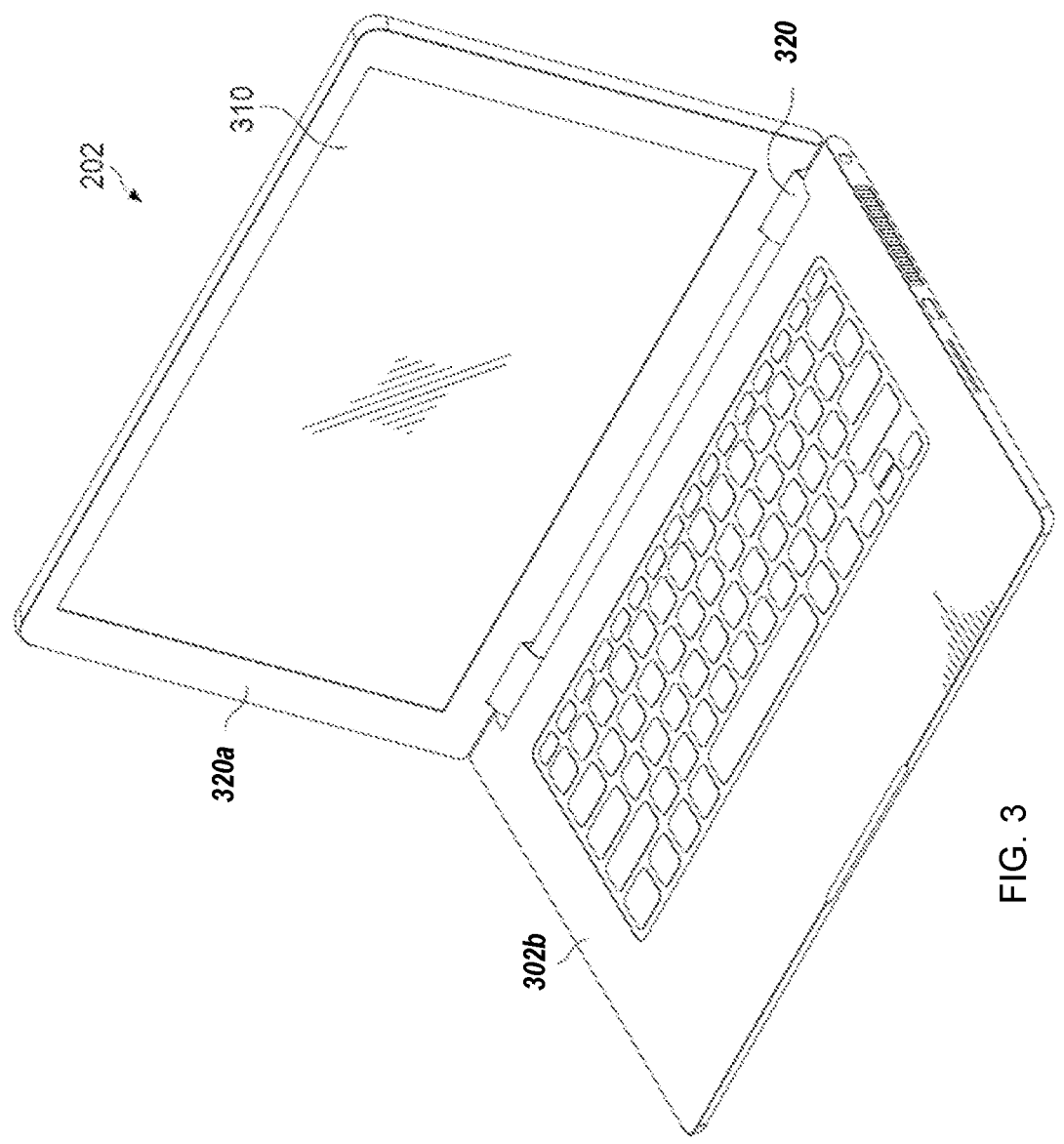
FIG. 3 illustrates a perspective view of the information handling system.

FIG. 3 illustrates a perspective view of the information handling system 202, in an open state. The information handling system 202 can include a first body 302a and a second body 302b (collectively referred to as bodies 302). The first body 302a can include a display 310. A hinge 320 can couple the first body 302a to the second body 320b. In some examples, the information handling system 202 is similar to, or includes, the information handling system 100 of FIG. 1.

Figure 4:
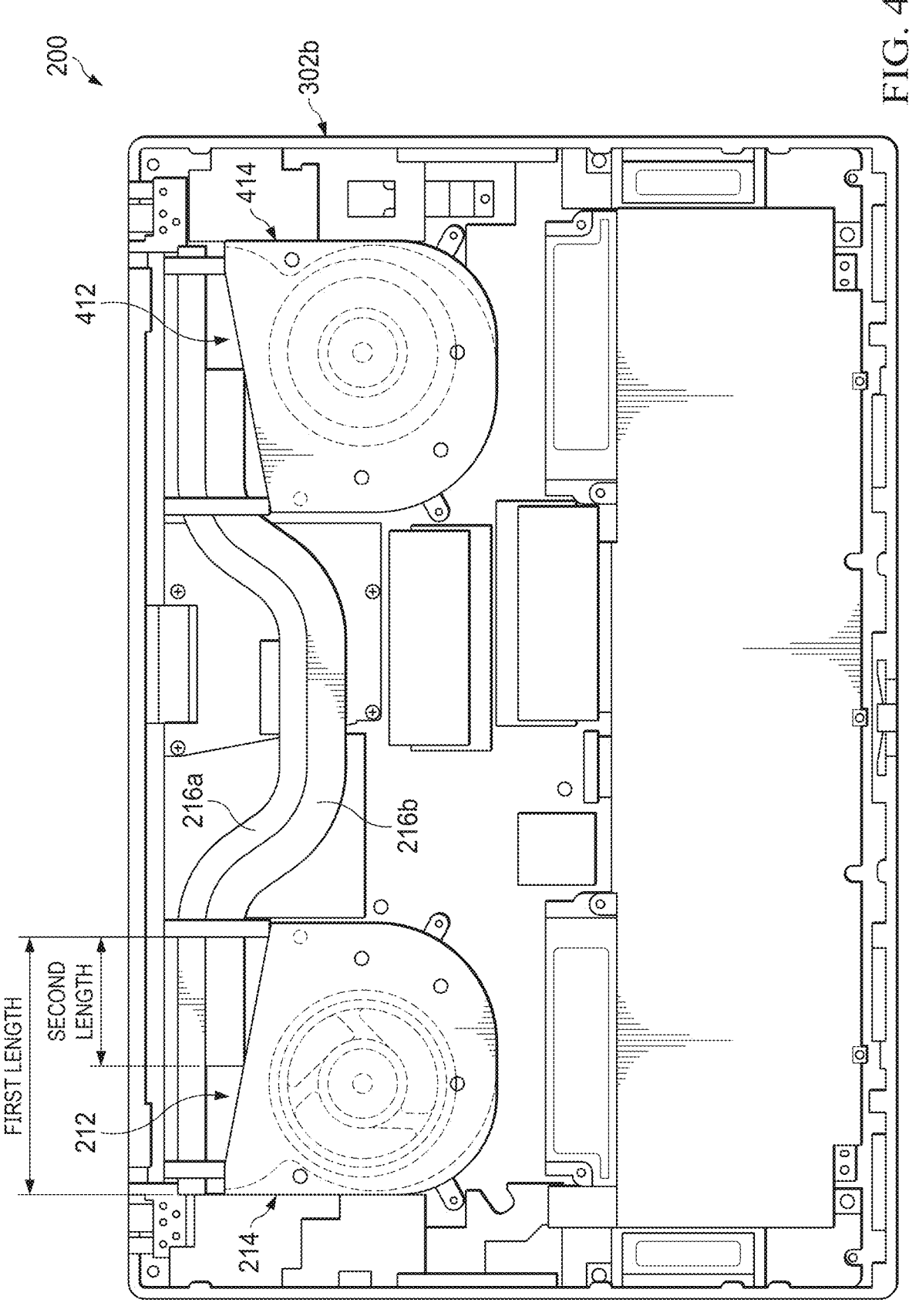
FIG. 4 illustrates a view of a bottom of the information handling system.

FIG. 4 illustrates a top-down view of the second body 302b of the information handling system 202. The second body 302b can include the heat sink 212, the fan 214, and heat pipes 216 (shown as heat pipes 216a, 216b). In some examples, the second body 302b can include an additional heat sink 412 and an additional fan 414, substantially the same as the heat sink 212 and the fan 214, respectively.

Figure 5:
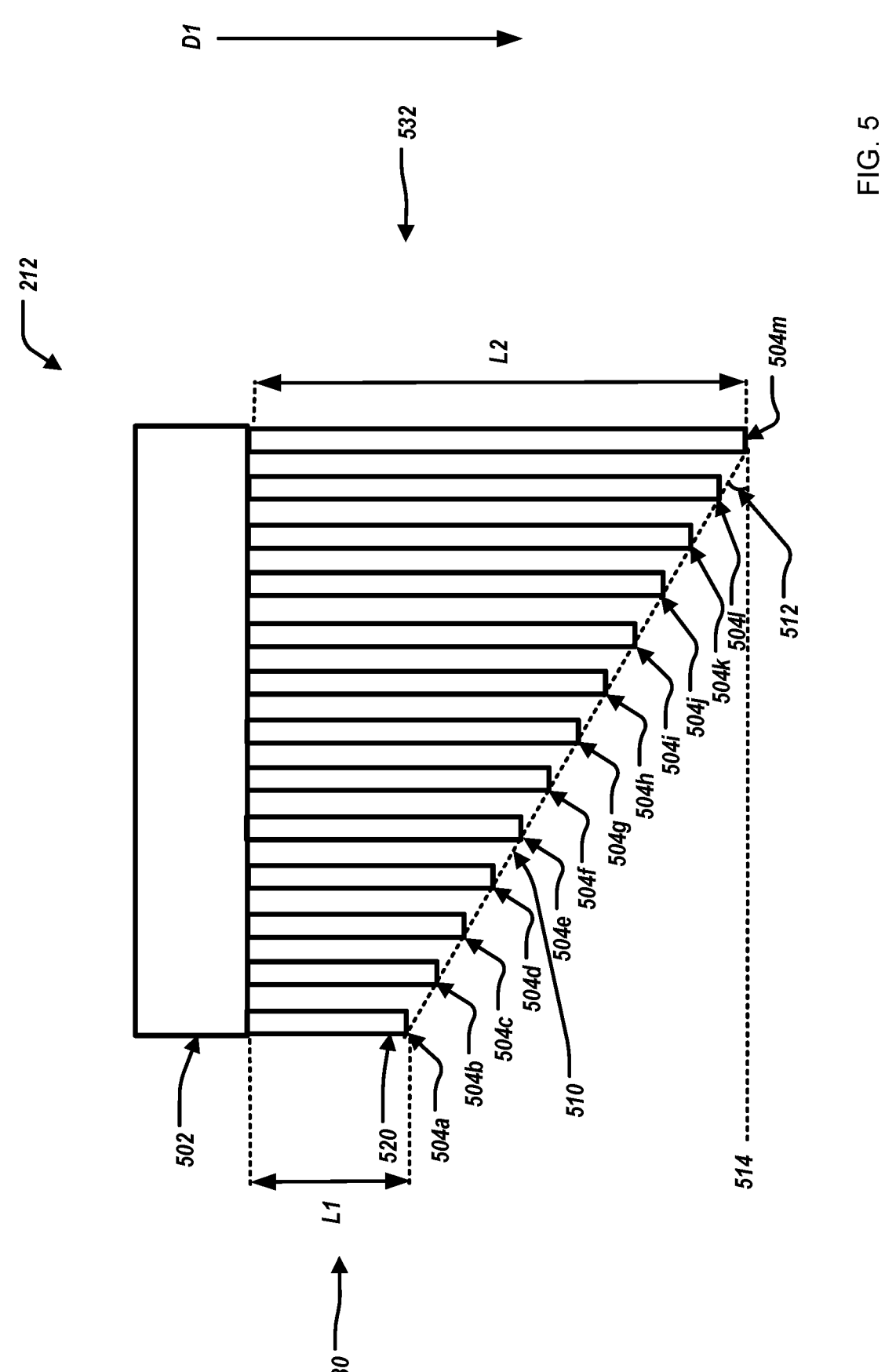
FIG. 5 illustrates a heat sink of the temperature management apparatus.

FIG. 5 illustrates a top down view of the heat sink 212. The heat sink 212 includes a base 502 and a plurality of fins 504a, 504b, . . . 504m (collectively referred to as fins 504); however, the heat sink 212 can include any number of fins 504. In some examples, the body 502 and the fins 504 can be formed from one congruent piece.

The fins 504 can extend from the base 502 in a first direction D1. The fins 504 form a first interface 510 of the heat sink 212. Specifically the first interface 510 forms a first angle 512 with respect to a plane 514. The plane 514 is perpendicular to the first direction D1. In some examples, the fins 504 can extend away from the body 502 in any direction such that the fins 504 form the first interface 510 at an angle with respect to plane 514.

The fins 504 can include a first end 520 space-apart from the body 502 (for simplicity of illustration, only first end 520 is shown for fin 504a). In some examples, the first end 504 is substantially parallel with the plane 514. In some examples, the first end 520 is angled with respect to the body 502 such that the first end 520 is at the first angle 512 with respect to the plane 514.

The heat sink 212 can include a first side 530 and a second side 532. The second side 532 is positioned opposite to the first side 530. The fin 504a can be associated with a first length L1. The fin 504a can be positioned at the first side 530 of the heat sink 212. The fin 504m can be associated with a second length L2. The fin 504m can be positioned at the second side 532 of the heat sink 212. In some examples, the second length L2 of the fin 504m at the second side 532 of the heat sink 212 is greater than the first length L1 of the fin 504a at the first side 530 of the heat sink 212.

In some examples, a length of the remaining fins 504 (fins 504b-504l) between the fin 504a and the fin 504m increases from the first end 530 of the heat sink 212 to the second end 532 of the heat sink 212. That is, for a particular fin 504, another fin 504 that is positioned closer to the second side 532 has a greater length than the particular fin 504; and, for the particular fin 504, a further fin 504 that is positioned closer to the first side 530 has a smaller length than the particular fin 504. For example, the fin 504b has a greater length than the fin 504a; the fin 504c has a greater length than the fin 504b; the fin 504d has a greater length than the fin 504c; the fin 504e has a greater length than the fin 504d; the fin 504f has a greater length than the fin 504e; the fin 504g has a greater length than the fin 504f; the fin 504h has a greater length than the fin 504g; the fin 504i has a greater length than the fin 504h; the fin 504j has a greater length than the fin 504i; the fin 504k has a greater length than the fin 504j; the fin 504l has a greater length than the fin 504k; and the fin 504m has a greater length than the fin 504l.

Figure 6:
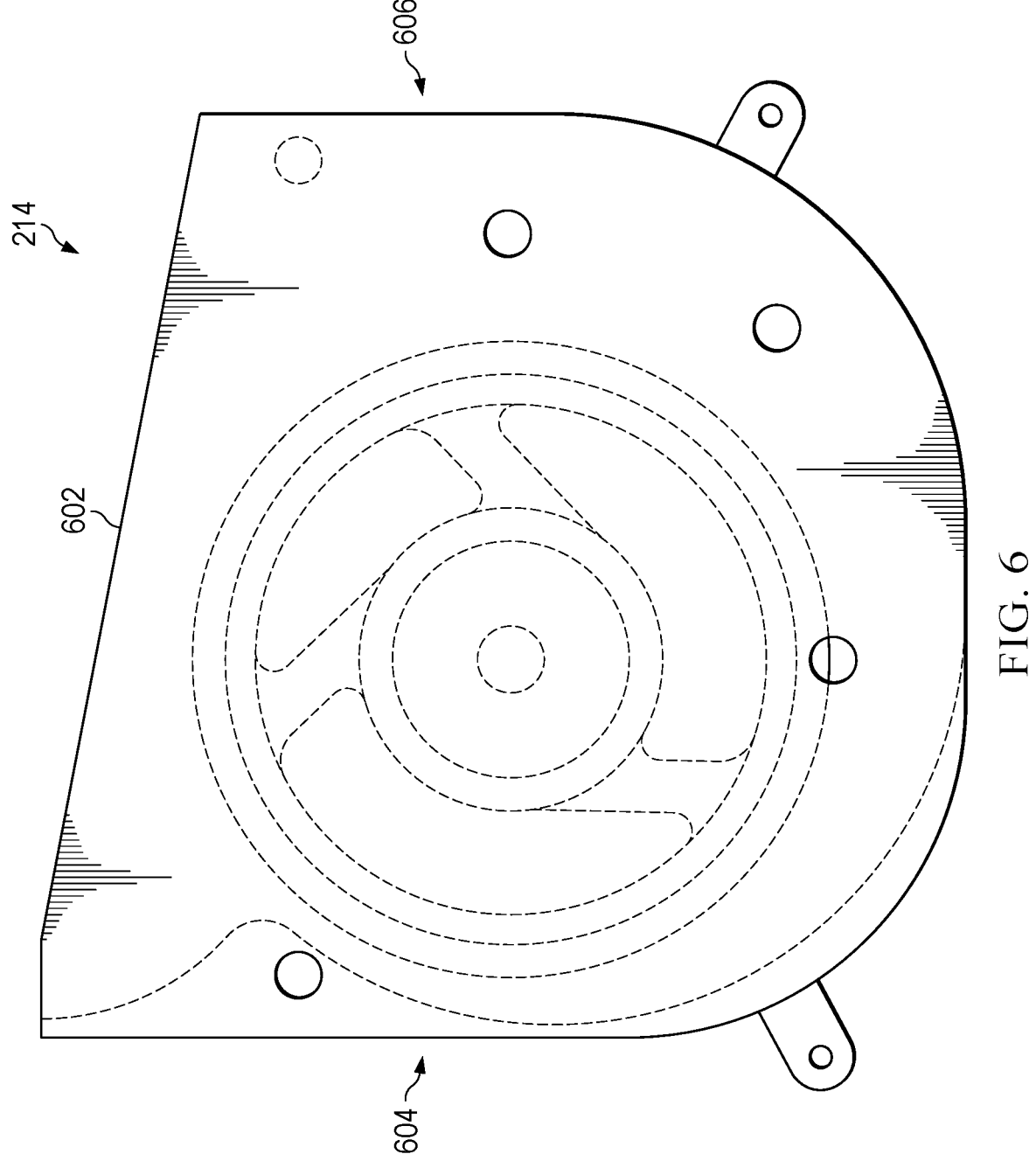
FIG. 6 illustrates a fan of the temperature management apparatus.

FIG. 6 illustrates the fan 214. In some examples, the fan 214 is a blower. The fan 214 can include a second interface 602. The fan 214 can include a first end 604 and a second end 606. The second end 606 is positioned opposite to the first end 604.

Figure 7:
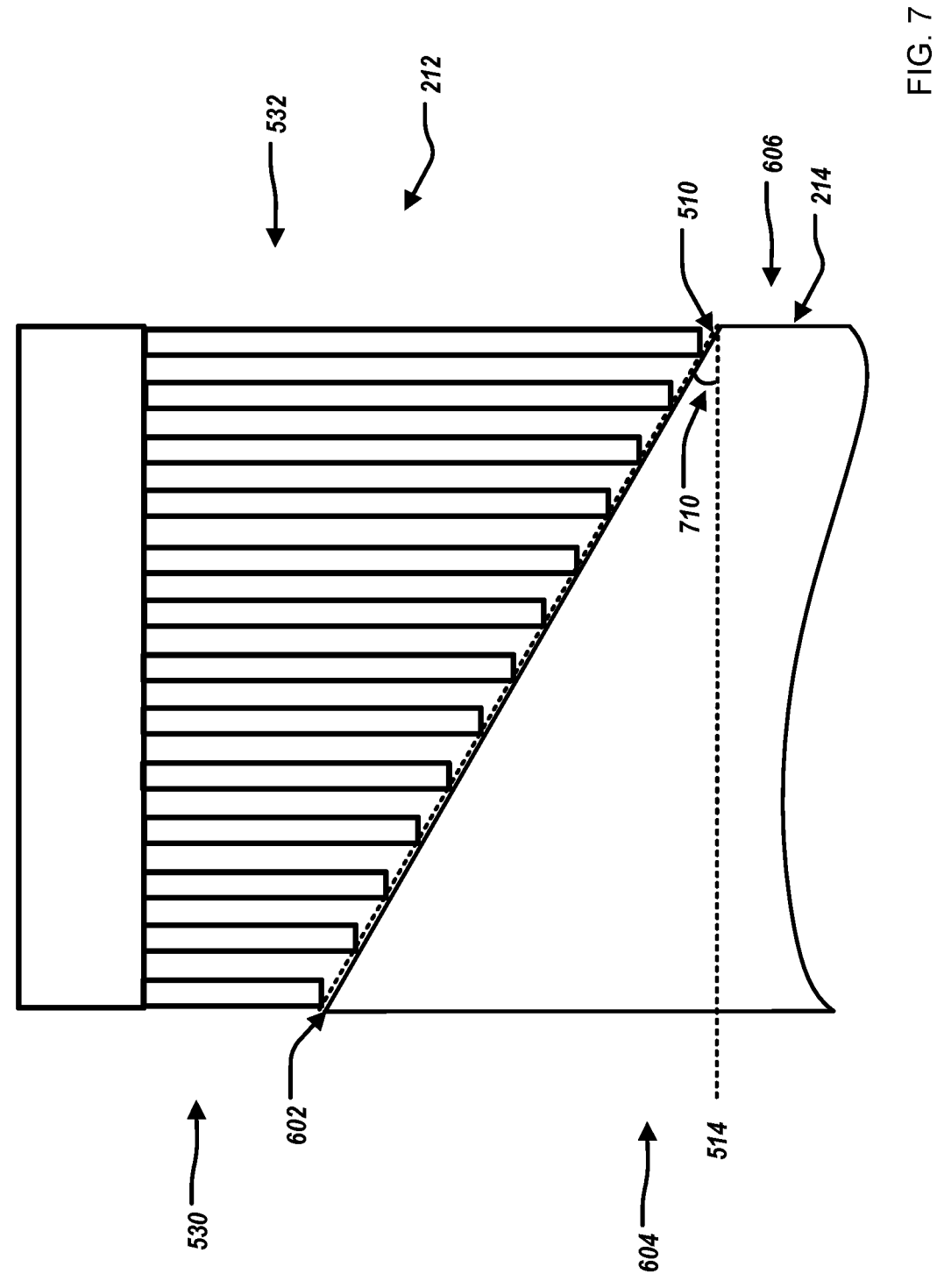
FIG. 7 illustrates the fan thermally coupled to the heat sink.

FIG. 7 illustrates the fan 214 thermally coupled to the heat sink 212. Specifically, the fan 214 is thermally coupled to the heat sink 212 such that the first interface 510 of the heat sink 212 is proximate to the second interface 602 of the fan 214. That is, the fan 214 is thermally coupled to the heat sink 212 such that the first interface 510 of the heat sink 212 is aligned with the second interface 602 of the fan 214. When the fan 214 is thermally coupled to the heat sink 212, the fan 214 can also be physically coupled to the heat sink 212.

When the fan 214 is thermally coupled to the heat sink 212, the heat sink 212 can form a second angle 710 with respect to the plane 514. Specifically, the second angle 710 can correspond to the first angle 512. In some examples, the second angle 710 is substantially the same as the first angle 512.

In some examples, the fan 214 is thermally coupled to the heat sink 212 such that the first end 604 of the fan 214 is positioned proximate to the first side 530 of the heat sink 212; and the second end 606 of the fan 214 is position proximate to the second side 532 of the heat sink 212.

In some examples, the fan 214 outputs air at the second interface 602 and the heat sink 212 receives such air. In some examples, the fan 214 can output air at the second interface 602 at the first end 604 of the fan 214 at a first velocity; and the fan 214 can output air at the second interface 602 at the second end 606 of the fan 214 at a second velocity. In some examples, the first velocity of the air output by the fan 214 at the second interface 602 at the first end 604 of the fan 214 is less than the second velocity of the air output by the fan 214 at the second interface 602 at the second end 606 of the fan 214. In some examples, the air output by the fan 214 at the second interface 602 varies across the second interface 602, with an increase of air velocity of the air output by the fan 214 at the second interface 602 from the first end 604 of the fan 214 to the second and 606 of the fan 214. Specifically, the air output by the fan 214 and the velocity of the air output by the fan 214 is not uniform across the second interphase 602 (non-linear).

Referring back to FIG. 4, a first heat pipe 216a and a second heat pipe 216b (heat pipes 216) can be coupled to the heat sink 212, the fan 214, or both. That is, the heat pipes 216 can be in thermal communication with the heat sink 212, the fan 214, or both. Additionally, the heat pipe 216a and the second heat pipe 216b can be coupled to the additional heat sink 412 and the additional fan 414. That is, the heat pipes 216 can be in thermal communication with the additional heat sink 412, the additional fan 414, or both.

Referring to FIGS. 4 and 5, in some examples, the first heat pipe 216a has a first length between the first side 530 and the second side 532 of the heat sink 212; and the second heat pipe 216b has a second length between the first side 530 and the second side 532 of the heat sink 212. The first length is greater than the second length. In some examples, the first and the second lengths can be based on the first angle 512 and/or the second angle 710.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A temperature management apparatus, including:
  a heat sink, including:
    a base;
    a plurality of fins extending from the base in a first direction, the plurality of fins forming a first interface having a first angle with respect to a plane that is perpendicular to the first direction;
  a fan including a second interface, the fan thermally coupled to the heat sink such that the second interface has a second angle with respect to the plane, the second angle being the same as the first angle, and
  wherein the plurality of fins are provided and exposed to an outer ambient environment between the base and the fan when the fan is aligned with the heat sink.

2. The temperature management apparatus of claim 1, wherein the fan is thermally coupled to the heat sink such that the first interface of the heat sink is proximate to the second interface of the fan.

3. The temperature management apparatus of claim 2, wherein the fan is thermally coupled to the heat sink such that the first interface of the heat sink is aligned with the second interface of the fan.

4. The temperature management apparatus of claim 1, wherein the heat sink includes a first side and a second side positioned opposite to the first side, wherein a first length of a first fin of the plurality of fins at the first side of the heat sink is less than a second length of a second fin of the plurality of fins at the second side of the heat sink.

5. The temperature management apparatus of claim 4, wherein a length of the remaining fins between the first fin and the second fin increase from the first side of the heat sink to the second side of the heat sink.

6. The temperature management apparatus of claim 4, wherein the fan includes a first end and a second end positioned opposite to the first end, wherein the fan is thermally coupled to the heat sink such that the first end of the fan is positioned proximate to the first side of the heat sink and the second end of the fan is positioned proximate to the second side of the heat sink, wherein a first velocity of air output by the fan at the second interface at the first end of the fan is less than a second velocity of air output by the fan at the second interface at the second end of the fan.

7. The temperature management apparatus of claim 4, further including a first and a second heat pipe in thermal communication with the heat sink, wherein the first heat pipe has a first length between the first side and the second side of the heat sink and the second heat pipe has a second length between the first side and the second side of the heat sink, wherein the first length is greater than the second length.

8. An information handling system, comprising:
a temperature management apparatus, including:
    a heat sink, including:
        a base;
        a plurality of fins extending from the base in a first direction, the plurality of fins forming a first interface having a first angle with respect to a plane that is perpendicular to the first direction;
        a fan including a second interface, the fan thermally coupled to the heat sink such that the second interface has a second angle with respect to the plane, the second angle being the same as the first angle, and
    wherein the plurality of fins are provided and exposed to an outer ambient environment between the base and the fan when the fan is aligned with the heat sink.

9. The information handling system of claim 8, wherein the fan is thermally coupled to the heat sink such that the first interface of the heat sink is proximate to the second interface of the fan.

10. The information handling system of claim 9, wherein the fan is thermally coupled to the heat sink such that the first interface of the heat sink is aligned with the second interface of the fan.

11. The information handling system of claim 8, wherein the heat sink includes a first side and a second side positioned opposite to the first side, wherein a first length of a first fin of the plurality of fins at the first side of the heat sink is less than a second length of a second fin of the plurality of fins at the second side of the heat sink.

12. The information handling system of claim 11, wherein a length of the remaining fins between the first fin and the second fin increase from the first side of the heat sink to the second side of the heat sink.

13. The information handling system of claim 12, wherein the fan includes a first end and a second end positioned opposite to the first end, wherein the fan is thermally coupled to the heat sink such that the first end of the fan is positioned proximate to the first side of the heat sink and the second end of the fan is positioned proximate to the second side of the heat sink, wherein a first velocity of air output by the fan at the second interface at the first end of the fan is less than a second velocity of air output by the fan at the second interface at the second end of the fan.

14. The information handling system of claim 11, further including a first and a second heat pipe in thermal communication with the heat sink, wherein the first heat pipe has a first length between the first side and the second side of the heat sink and the second heat pipe has a second length between the first side and the second side of the heat sink, wherein the first length is greater than the second length.

* * * * *